(12) United States Patent
Chung et al.

(10) Patent No.: US 6,967,839 B2
(45) Date of Patent: Nov. 22, 2005

(54) COOLING DEVICE FOR LIGHT VALVE

(75) Inventors: Tai-Ling Chung, Hsinchu (TW);
Chi-Chui Yun, Hsinchu (TW);
Ching-Chung Nien, Hsinchu (TW)

(73) Assignee: Young Optics Inc., Hsinchu (TW)

( * ) Notice: Subject to any disclaimer, the term of this patent is extended or adjusted under 35 U.S.C. 154(b) by 258 days.

(21) Appl. No.: 10/657,274

(22) Filed: Sep. 9, 2003

(65) Prior Publication Data

US 2004/0100769 A1    May 27, 2004

(30) Foreign Application Priority Data

Nov. 21, 2002   (TW) .............................. 91219081 U

(51) Int. Cl.[7] .............................................. H05K 7/20
(52) U.S. Cl. ...................... 361/695; 361/687; 361/719; 353/57; 353/75; 315/32
(58) Field of Search ................. 361/686, 687, 361/695, 697, 717–719, 690, 704–712; 353/52, 353/53, 57, 58, 60, 61, 100, 119, 75; 315/32; 174/16.3, 35 R, 35 GC, 51 R; 257/706–707, 257/712–713, 718–719; 165/80.2, 80.3, 80.4

(56) References Cited

U.S. PATENT DOCUMENTS

| | | | |
|---|---|---|---|
| 5,740,013 A * | 4/1998 | Roesner et al. | ............. 361/697 |
| 6,568,813 B1 * | 5/2003 | Haba et al. | ................... 353/57 |
| 6,779,894 B2 * | 8/2004 | Shiraishi et al. | .............. 353/57 |
| 2003/0085659 A1 * | 5/2003 | Overmann et al. | ........... 315/32 |

\* cited by examiner

*Primary Examiner*—Michael Datskovskiy
(74) *Attorney, Agent, or Firm*—Bacon & Thomas PLLC

(57) ABSTRACT

A cooling device includes a printed circuit board having a hole, a light valve disposed on the front surface of the printed circuit board, and a thermal diffuser disposed on the back surface of the printed circuit board. Therefore, the thermal diffuser can contact the light valve through the whole, and directly receives heat from the light valve. Guided by partition wall and channels, a fan of the thermal diffuser sucks airflows into stream channels to fully exchange heat with diffuser fins for cooling the light valve, so that the cooling efficiency of the light valve can be increased. Then, the airflows blow and cool the printed circuit board to form an integrated cooling system.

7 Claims, 4 Drawing Sheets

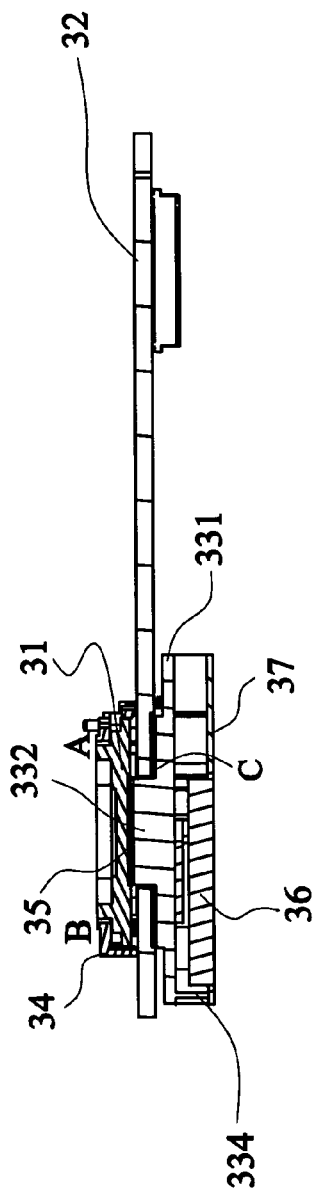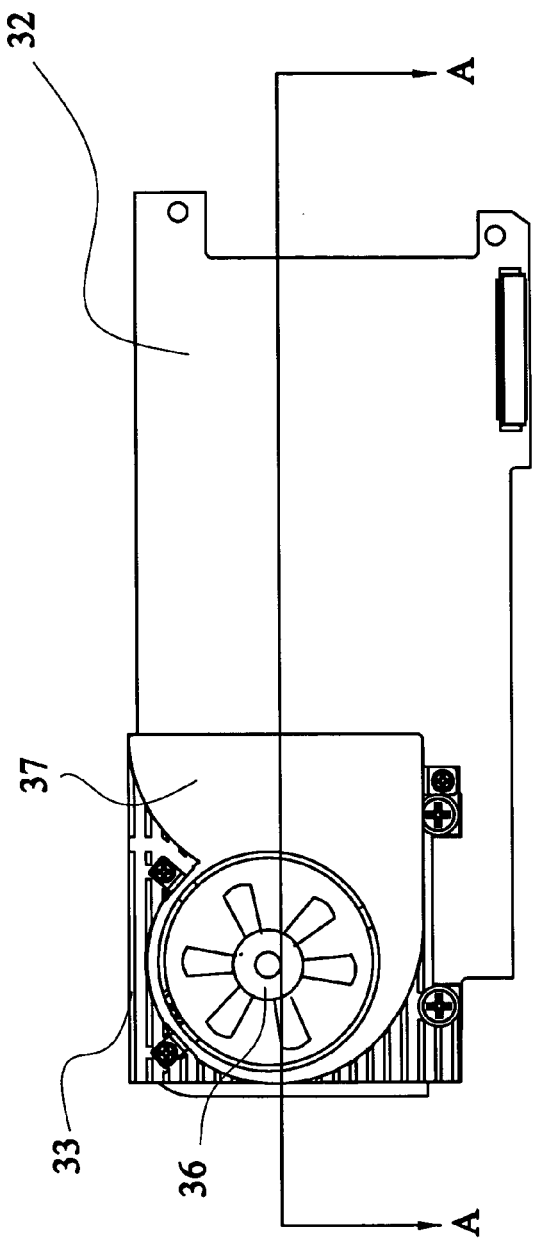
FIG. 4(B)
FIG. 4(A)

| Lamp power | Testing point | Prior Art | Present Invention |
|---|---|---|---|
| 200 W | A | 53.3 °C | 46.9 °C |
| | B | 49.3 °C | 44.8 °C |
| | C | 49.8 °C | 42.4 °C |
| 250 W | A | 59.9 °C | 51.8 °C |
| | B | 55.4 °C | 48.8 °C |
| | C | 56.2 °C | 46.0 °C |

FIG. 5

COOLING DEVICE FOR LIGHT VALVE

BACKGROUND OF THE INVENTION

1. Field of the Invention

The present invention relates to a projection display apparatus, and more particularly to a cooling device for a light valve for use in the projection display apparatus.

2. Description of the Related Art

Among the projection display apparatus, the light valve directly affects the quality of projection images, which is the most important projection optical device. Therefore, how to keep the working temperature of the light valve is important. As shown in FIG. 1, Taiwanese patent application No. 86113926 is a projection display of the prior art. The light valve 11 is fixed on the printed circuit board 12. A cooling device 13 is placed on the back surface of the printed circuit board 12 where is relative to the light valve 11. The cooling device 13 has a plurality of diffuser fins 131 which are parallel and protruding. The diffuser fins 131 conduct heat to the surrounding air for rising the air temperature to form the natural convection for heat exchange and cooling the light valve 11. The cooling device 13, by the heat buoyancy to cause the natural convection, can't actively diffuse heat so the cooling efficiency isn't good.

Referring to FIG. 2 showing another cooling device for a light valve of the prior art, a light valve 21 is fixed on a printed circuit board 23 with a fixed frame 22. A thermal diffuser 24 is placed on the back surface of the printed circuit board 23 where is relative to the light valve 21. The thermal diffuser 24 has a plurality of diffuser fins 241 which are parallel and protruding. Over the center of the diffuser fins 241 has an axial-flow fan 25. By rotating the axial-flow fan 25 to draw the air, let the air pass through the diffuser fins 241 to raise the cooling efficiency of the diffuser fins 241. However, the diffuser fins 241 of the thermal diffuser 24 is horizontally arranged, which doesn't guide the air as streamline. The axial-flow fan 25 blows the air directly to the diffuser fins 241 so that the air easily passes through the upper end of the diffuser fins 241 but can't fully exchange heat with the diffuser fins 241. Meanwhile, the airflows easily become the turbulences and loss. In addition, the central motor of the axial-flow fan 25 is arranged at the center of the cooling device 24 where is the location that the light valve 21 produces heat source. Heat can't take by the diffuser fins 241 quickly so the cooling efficiency can't raise and affect the operation quality of the light valve 21.

SUMMARY OF THE INVENTION

An object of the present invention is to provide a cooling device for a light valve, which uses the streamline diffuser fins and a partition wall to guide airflows to reduce the turbulences and increase the cooling efficiency of the diffuser fins.

Another object of the present invention is to provide a cooling device for a light valve, which uses casing cooperating with the diffuser fins to form the channel, so the air and the diffuser fins can fully exchange heat to rise the cooling efficiency and lower the noises of the fan.

Still another object of the present invention is to provide a cooling device for a light valve, which arranges the thermal diffuser and the printed circuit board to thin the cooling device for the light valve and quickly diffuse heat produced by the heat source of the light valve to keep the light valve at properly working temperature.

Yet another object of the present invention is to provide a cooling device for a light valve, which uses the air from the cooling diffuser fins to directly cool the electrical device on the printed circuit broad for light valve, and doesn't need other fans for cooling, so the whole cooling system is easier to plan.

To achieve the above and other objects, the present invention includes a printed circuit board having a hole, a light valve disposed on the front surface of the printed circuit board, and a thermal diffuser disposed on the back surface of the printed circuit board. Therefore, the thermal diffuser can contact the light valve through the whole, and directly receives heat from the light valve. Guided by partition walls and channels, a fan of the thermal diffuser sucks airflows into stream channels to fully exchange heat with diffuser fins for cooling the light valve, so that the cooling efficiency of the light valve can be increased. Then, the airflows blow and cool the printed circuit board. As a result, an integrated cooling system is formed.

BRIEF DESCRIPTION OF THE DRAWINGS

The above and other objects, advantages, and features of the present invention will be understood from the following detailed description of the invention when considered in connection with the accompanying drawings below.

FIG. 4(A) is an upper view showing the cooling device for light valve of the present invention.

FIG. 4(B) is a section view showing the cooling device for light valve of the present invention.

FIG. 5 is an experiment data showing the cooling device for light valve of the present invention.

DETAILED DESCRIPTION OF THE INVENTION

Figure 1:
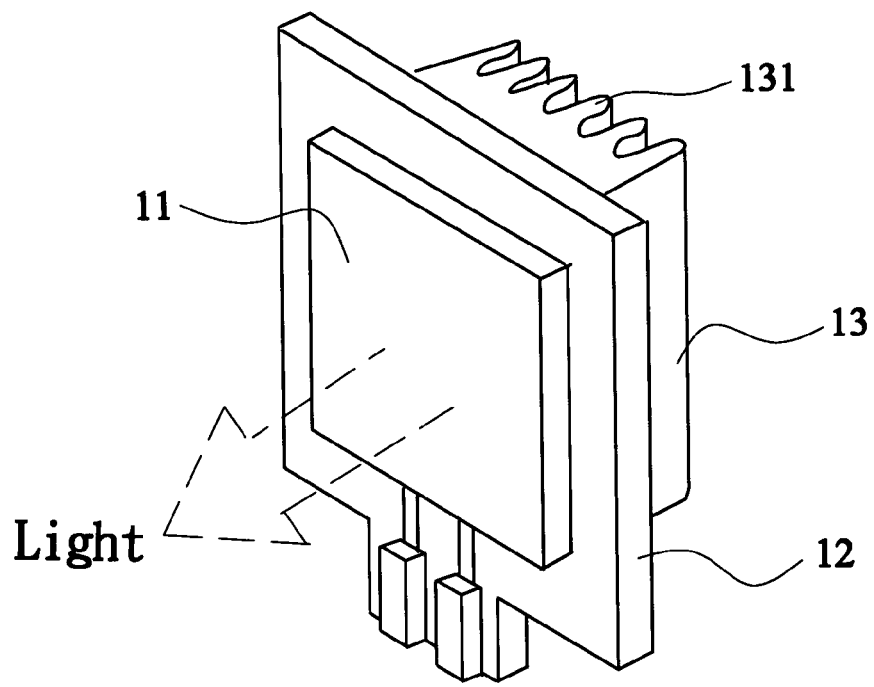
FIG. 1 is a perspective view of a cooling device for light valve of the prior art.
Figure 2:
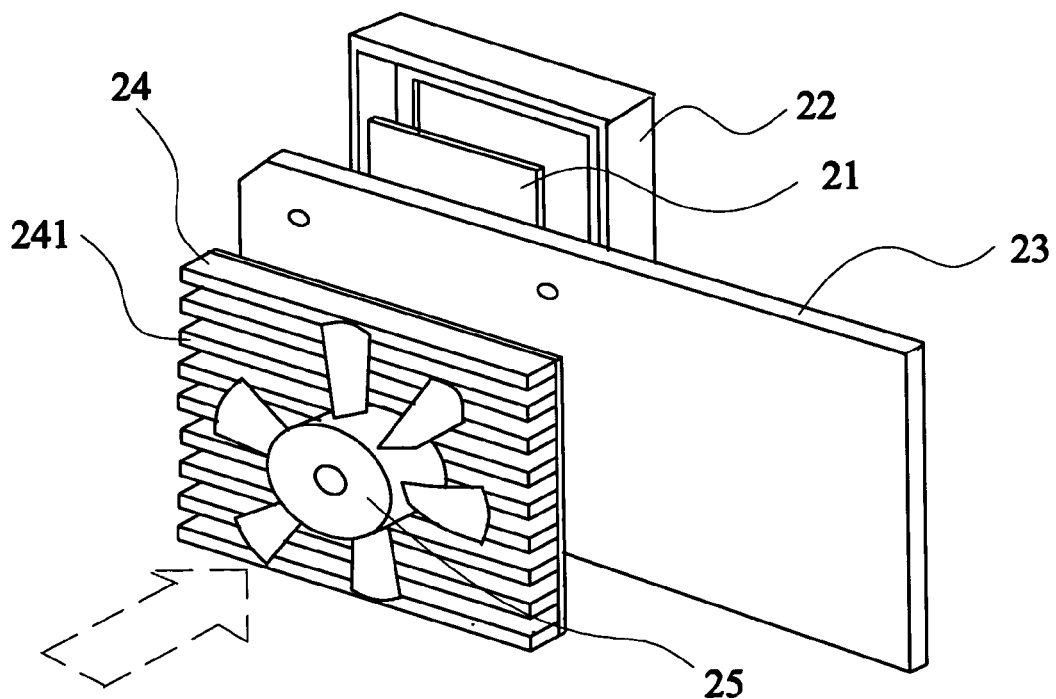
FIG. 2 is an explored view showing another cooling device for light valve of the prior art.
Figure 3:
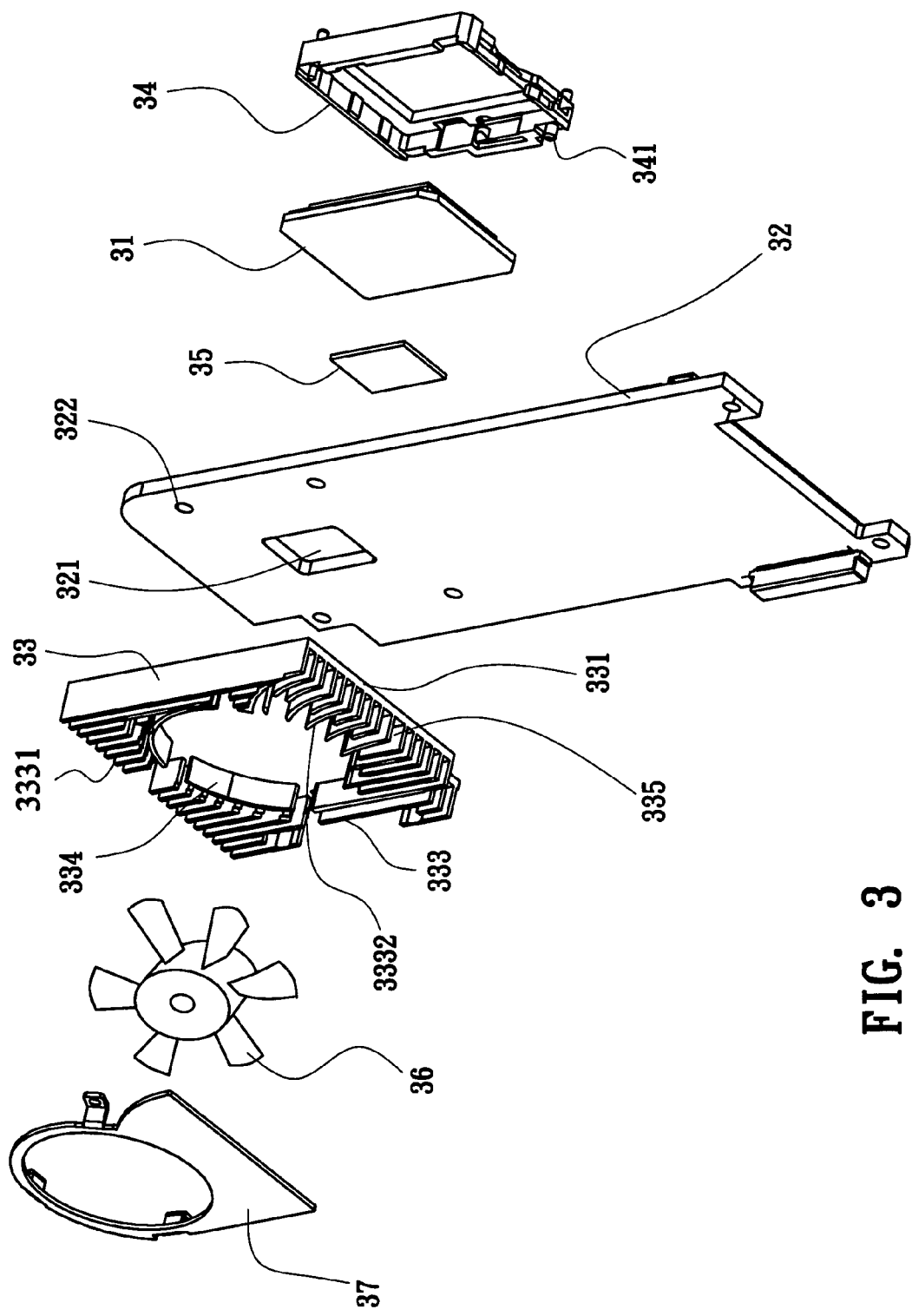
FIG. 3 is an explored view showing the cooling device for light valve of the present invention.

Referring to FIG. 3, a cooling device for a light valve of the present invention comprises a light valve 31, a printed circuit board 32, and a thermal diffuser 33. The light valve 31 and thermal diffuser 33 are respectively disposed on the relative position of the front and back surface of the printed circuit board 32 to form the cooling device for the light valve 31.

One end of the printed circuit board 32 has a square hole 321, the 4 edges of the hole 321 respectively having a fixed hole 322. The light valve 31 is disposed within a fixed frame 34. A diagonal edge of the fixed frame 34 has a fixed pin 341 which passes trough the relative fixed hole 322 to fix the light valve 31 on the front surface of the printed circuit board 32. Between the light valve 31 and the printed circuit board 32 adds a diffuser pad 35 which covers the hole 321 to disperse heat of the light valve 31.

In addition, the back surface of the printed circuit board 32 relative to the light valve 31 disposes a thermal diffuser 33, the thermal diffuser 33 having a base plate 331. The back surface of the base plate 331 protrudes a convex 332 [Referring to FIG. 4(B)] which passes through the hole 321, connects and supports the diffuser pad 35. The front surface of the base plate 331 adjacent to the end of the printed circuit broad 32 has a fan 36. The base plate 331 around the fan 36 protrudes a plurality of diffuser fins 333 to decrease the thickness of the thermal diffuser 33. These outer diffuser fins 3331 adjacent to the outer edge of the printed circuit board 32 are parallel to each other, and a partition wall 334 is formed between the fan 36 and the outer diffuser fins 3331. In addition, these inner diffuser fins 3332 adjacent to the inside of the printed circuit board 32 basically are parallel arrangement, but adjacent to the edge of the fan 36, the inner diffuser fins 3332 are formed as streamline in accordance with the airflows. The upper ends of the inner diffuser fins 3332 are covered by the casing 37 such that the casing 37 and the inner diffuser fins 3332 assembled to form a plurality of airflows guiding channels 335.

Referring to FIGS. 4(A) and (B) showing the cooling device for the light valve 31 of the present invention, heat produced by the light valve 31 conducts to the printed circuit board 32 behind the back surface of the light valve 31 and to the diffuser pad 35. Then, through the convex 332, heat guides to the center of the base plate 331, and dispread heat to the whole base plate 331. By disposing the fan 36 aside, the thermal diffuser 33 uses the fan 36 to draw the air so that the air can directly contact the center of the base plate 331 for cooling the diffuser pad 35 on which heat converges. Then, the cooling air is pushed by the fan 36, and guided by the partition wall 334 and the streamline inner diffuser fins 3332. Not only reduces the wind resistance, but also guides more air into the channel 335 to fully contact and heat exchange with the inner diffuser fins 3332. So heat, which the base plate 331 absorbs from the printed circuit board 32 and the diffuser pad 35 can be quickly guided out by the air to raise the cooling efficiency of the light valve 31. In addition, guided by the channel 335, the cooling air flows out of the channel 335 to blow the electrical devices on the printed circuit board 32 for cooling the electrical devices and fully using the cooling air efficiency. Thus, the cooling device for the light valve 31 forms a single cooling system without other cooling systems to support cooling, so the cooling streamline of the whole projection display apparatus is easier to plan.

Additionally, for close to the casing or closed end of the projector or the enter of air, backflows opposite to the airflows produced by the fan 36 is easily formed on the outer diffuser fins 3331 adjacent to outer edge the printed circuit board 32 to cause the wind resistance. Therefore, one end of the outer diffuser fins 3331 is separated by the partition wall 334 to lower the wind resistance. The present invention places the fan 36 aside to decrease the areas of the outer diffuser fins 3331 and keep the cooling style of the outer diffuser fins 3331 as natural convection to help cooling. The cooling device of the present invention increase the cooling efficiency of the light valve 31, properly decreases the rotational speed of the fan 36, keeps the light valve 31 at normal working temperature, and lowers the noises of the fan 36.

Referring to FIG. 4, the cooling efficiency of the present invention compares to the prior art. Each testing points A, B (A and B are on the two front sides of the light valve 31), and C (C is on the back surface of the printed circuit broad 32 adjacent to the center of the light valve 31) are individually illuminated by the 200 W and 250 W light lamps to do the temperature testing. The temperature record is shown as FIG. 5. The temperature of the testing points A, B, and C of the present invention is lower, especially the temperature of the back surface of the printed circuit board 32 adjacent to the center of the light valve 31, i.e. the testing points C, from 49.8° C. and 56.2° C. respectively lower to 42.4° C. and 46.0° C. It is apparent that the cooling efficiency of the present invention is improved obviously.

It will be apparent to those skilled in the art that in light of the forgoing disclosure, many alternations and modifications are possible in the practice of this invention without departing from the spirit or scoop thereof. Accordingly, the scoop of the invention is to be considered in accordance with the substance defined in the following claims.

What is claimed is:

1. A cooling device for light valve, comprising:
   a printed circuit board;
   a light valve which is disposed in the front of a front surface of said printed circuit board; and
   a thermal diffuser disposed behind a back surface of said printed circuit board opposite to said light valve, which has a fan in the center, around said fan having a plurality of diffuser fins,
   wherein one end of said diffuser fins forms streamline channels to guide airflows cooling said printed circuit board.

2. The cooling device for light valve according to claim 1, wherein said printed circuit board has a hole on the back surface center of said light valve, the back surface of said light valve having a diffuser pad on said hole.

3. The cooling device for light valve according to claim 2, wherein said thermal diffuser has a base plate, said diffuser fins and said fan disposed on the front surface of said base plate, wherein the back surface of said thermal diffuser has a convex passing through said hole, connecting, and supporting said diffuser pad.

4. The cooling device for light valve according to claim 1, wherein said channels are formed by a casing which covers the upper end of said diffuser fins.

5. The cooling device for light valve according to claim 1, wherein the edge of said channel adjacent to said fan is formed by bending said diffuser fins as streamline.

6. The cooling device for light valve according to claim 1, further comprising a partition wall between said fan and said diffuser fins opposite to said streamline channels.

7. The cooling device for light valve according to claim 1, wherein said fan is disposed close to said diffuser fins which is relative to said streamline channels.

* * * * *